(12) United States Patent
Hayashi

(10) Patent No.: US 8,300,487 B2
(45) Date of Patent: Oct. 30, 2012

(54) SEMICONDUCTOR DEVICE

(75) Inventor: Tomonori Hayashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 350 days.

(21) Appl. No.: 12/695,364

(22) Filed: Jan. 28, 2010

(65) Prior Publication Data

US 2010/0195428 A1    Aug. 5, 2010

(30) Foreign Application Priority Data

Feb. 4, 2009    (JP) .................................. 2009-023885

(51) Int. Cl.
*G11C 7/00* (2006.01)

(52) U.S. Cl. .................... 365/219; 365/201; 365/189.02; 365/189.04; 365/189.03; 365/189.17; 714/718; 714/724

(58) Field of Classification Search .................. 365/219, 365/201, 189.02, 189.04, 189.03, 189.17
See application file for complete search history.

(56) References Cited

U.S. PATENT DOCUMENTS

| | | | |
|---|---|---|---|
| 6,331,958 B2 * | 12/2001 | Tsukude ....................... | 365/201 |
| 6,337,832 B1 * | 1/2002 | Ooishi et al. ............. | 365/233.12 |
| 6,519,194 B2 * | 2/2003 | Tsujino et al. ................ | 365/201 |
| 6,671,836 B1 * | 12/2003 | Lai et al. ......................... | 714/718 |
| 6,826,101 B2 * | 11/2004 | Fukuyama ..................... | 365/201 |
| 6,898,139 B2 * | 5/2005 | Lee et al. ....................... | 365/221 |
| 7,124,334 B2 * | 10/2006 | Kashiwakura ................ | 714/712 |
| 7,245,141 B2 * | 7/2007 | Ong ......................... | 324/762.02 |
| 7,363,558 B2 * | 4/2008 | Fukuyama ..................... | 714/724 |
| 7,864,606 B2 * | 1/2011 | Kushnarenko ................ | 365/201 |
| 8,125,843 B2 * | 2/2012 | Konda ........................... | 365/201 |

FOREIGN PATENT DOCUMENTS

| | | |
|---|---|---|
| JP | 6-118141 | 4/1994 |
| JP | 10-223000 | 8/1998 |
| JP | 2001-6396 | 1/2001 |
| JP | 2007-13079 | 1/2007 |

* cited by examiner

*Primary Examiner* — Viet Q Nguyen

(74) *Attorney, Agent, or Firm* — Morrison & Foerster LLP

(57) ABSTRACT

A semiconductor device comprises a plurality of terminals, a plurality of drive units corresponding to the plurality of terminals, and a data control unit. The data control unit outputs parallel data applied to the plurality of terminals to the plurality of drive unit in a normal operation mode, and converts serial data applied to a particular terminal, which is one of the plurality of terminals, to parallel data, and outputs the parallel data to which the serial data applied to the particular terminal is converted to the plurality of drive units in a test mode.

9 Claims, 10 Drawing Sheets

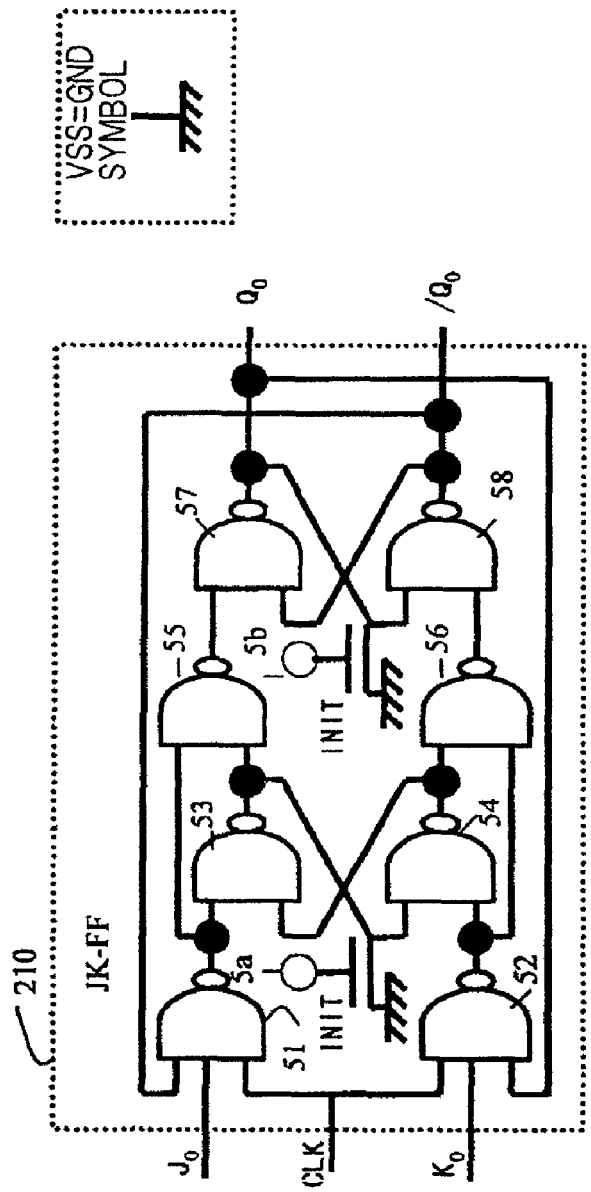

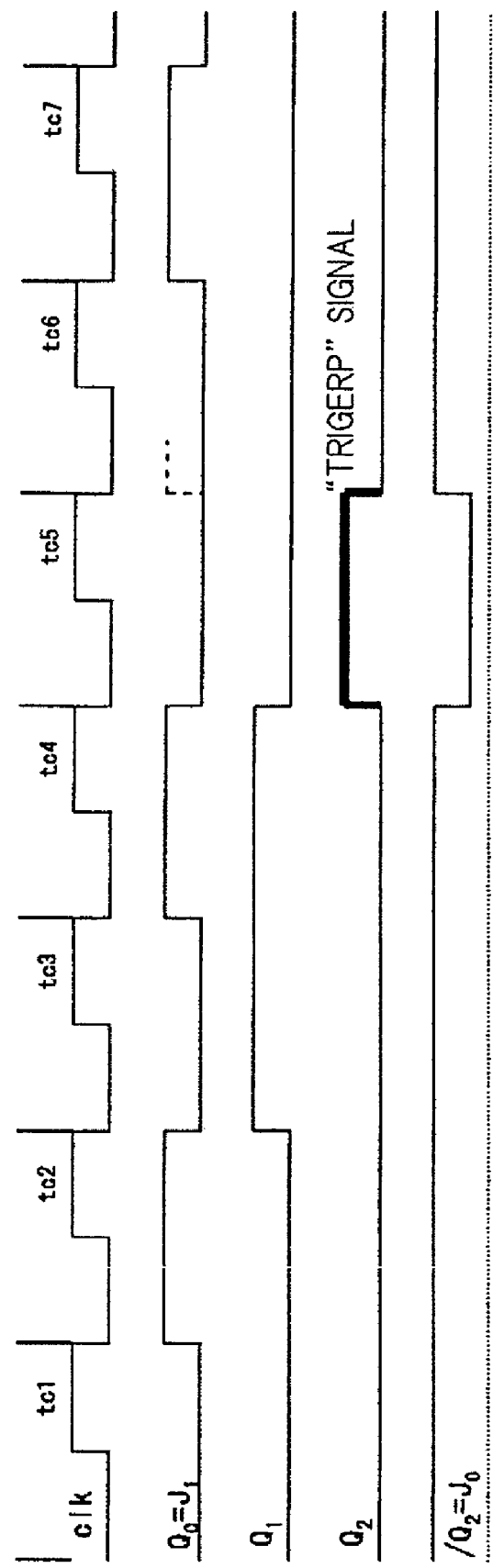

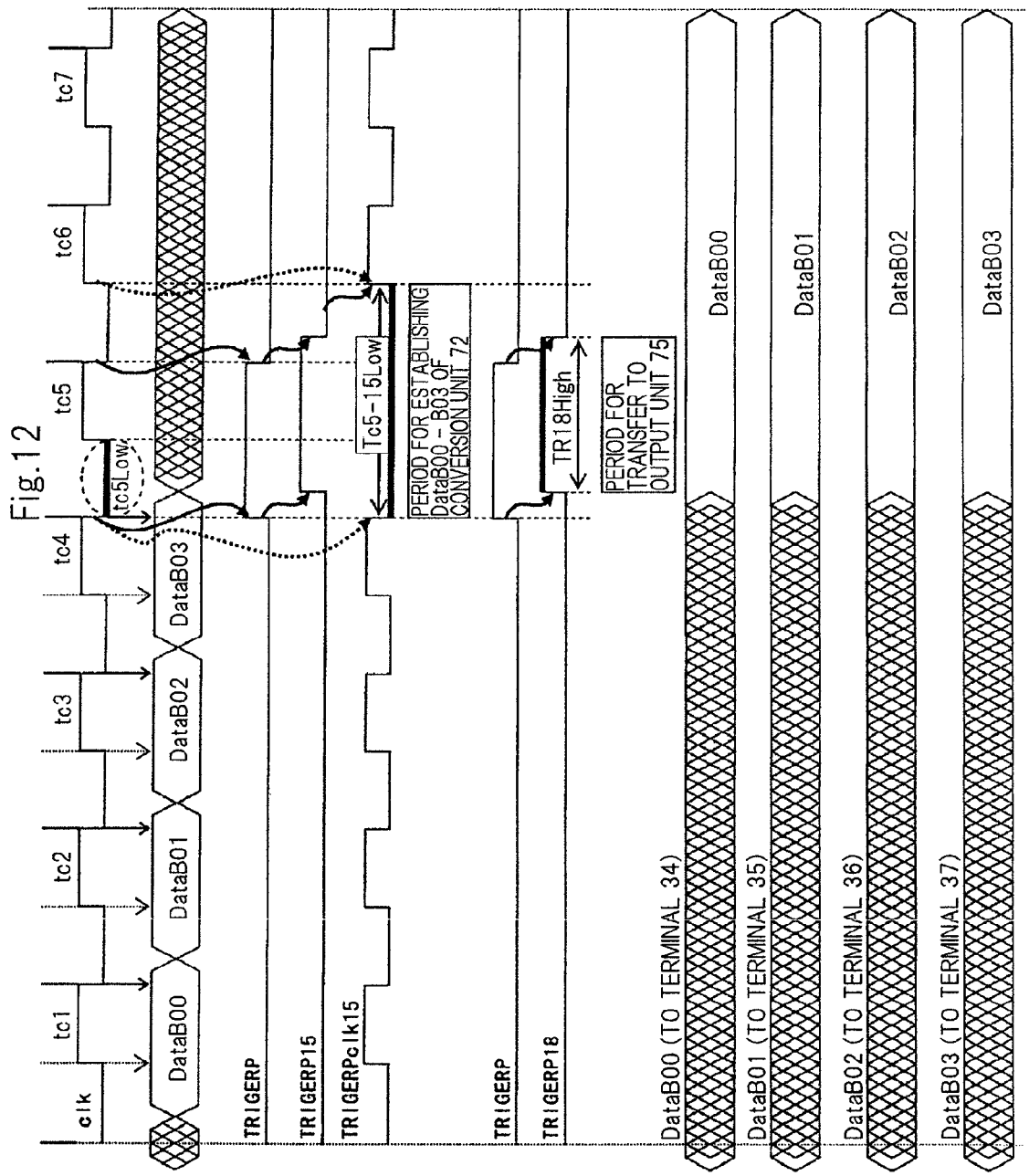

SEMICONDUCTOR DEVICE

This application is based upon and claims the benefit of priority from Japanese patent application No. 2009-23885, filed on Feb. 4, 2009, the disclosure of which is incorporated herein in its entirety by reference.

BACKGROUND OF THE INVENTION

1. Field of the Invention

The present invention relates to a semiconductor device, and more particularly, to a semiconductor device which has a test mode.

2. Description of Related Art

JP2001-6396A describes a semiconductor integrated circuit which has a test mode for conducting a test for reading/writing data from/into memory cells.

In this semiconductor integrated circuit, serial data is applied not only in the test mode but also in a normal operation mode, and the serial data is converted to parallel data which is then output to a plurality of write units. Each write unit writes the data to a memory cell corresponding thereto in accordance with the data supplied thereto.

In the semiconductor integrated circuit described in JP2001-6396A, serial data is applied even in the normal operation mode, and the serial data is converted to parallel data which is simultaneously written into a plurality of memory cells.

For this reason, the semiconductor integrated circuit described in JP2001-6396A implies a problem that processing is required to convert serial data to parallel data in the normal operation mode.

FIG. 1 is a circuit diagram showing a semiconductor device which was designed by the inventors of the present application for solving the foregoing problem.

In FIG. 1, semiconductor device 100 comprises input unit 200, buffer unit 300, switch unit 400, and data write unit 500.

Input unit 200 includes four terminals DQ0-DQ3. Input unit 200 receives a write command (hereinafter called the "WRT command") and a clock (hereinafter called "clk") signal, and also receives data at terminals DQ0-DQ3.

In a normal operation mode, parallel data is applied to terminals DQ0-DQ3. In a test mode, on the other hand, serial data for testing is applied to terminal DQ0 among terminals DQ0-DQ3.

Buffer unit 300 includes DQ0 buffer circuit 3000, DQ1 buffer circuit 3001, DQ2 buffer circuit 3002, and DQ3 buffer circuit 3003.

DQ0 buffer circuit 3000, upon receipt of a WRT command and a clk signal from input unit 200, captures data received at terminal DQ0, and outputs the data as DataB0.

DQ1 buffer circuit 3001, upon receipt of a WRT command and a clk signal from input unit 200, captures data received at terminal DQ1, and outputs the data as DataB1.

DQ2 buffer circuit 3002, upon receipt of a WRT command and a clk signal from input unit 200, captures data received at terminal DQ2, and outputs the data as DataB2.

DQ3 buffer circuit 3003, upon receipt of a WRT command and a clk signal from input unit 200, captures data received at terminal DQ3, and outputs the data as DataB3.

Switch unit 400 includes switches SW1-SW3, and switch control unit 400A.

Switch control unit 400A connects switches SW1-SW3 to normal side terminals 4001-4003, respectively, when switch control unit 400A is not receiving control signal tes1$dq$ which specifies the test mode, i.e., in the normal operation mode. On the other hand, switch control unit 400A connects switches SW1-SW3 to 1DQ test side terminals 400$a$-400$c$, respectively, when switch control unit 400A is receiving control signal tes1$dq$, i.e., in the test mode.

Specifically, normal side terminal 4001 is receiving DataB1, normal side terminal 4002 is receiving DataB2, and normal side terminal 4003 is receiving DataB3. Also, 1DQ test side terminals 400$a$-400$c$ are receiving DataB0.

Data write unit 500 includes four write units SA0-SA3 and memory cell area 500$a$. Write units SA0-SA3 are mapped to terminals DQ0-DQ3, respectively. Specifically, write unit SA0 is mapped to terminal DQ0; write unit SA1 to terminal DQ1; and write unit SA2 to terminal DQ2; and write unit SA3 to terminal DQ3.

Each write unit SA0-SA3 comprises two bit lines, specifically, Bit line xT(x=0, 1, 2, 3) and Bit line xN (x=0, 1, 2, 3), where x corresponds to the suffix of SA.

Each bit line is arranged as shown in FIG. 1.

Each write unit SA0-SA3 writes information into memory cell area 500$a$ based on data from switch unit 400.

Each write unit SA0-SA3 transmits a signal representative of data "1" to Bit line xT associated therewith when it receives data "1," and transmits a signal representative of data "1" to Bit line xN associated therewith when it receives data "0" to write information into memory cell area 500$a$.

Semiconductor device 100 receives parallel data at terminals DQ0-DQ3 in the normal operation mode, and reduces terminals DQ0-DQ3 into terminal DQ0 (particular terminal) in the test mode to receive serial test data for terminals DQ0-DQ3 at terminal DQ0.

Switch unit 400 outputs parallel data applied to terminals DQ0-DQ3 to write units SA0-SA3 corresponding to terminals DQ0-DQ3 in the normal operation mode. Each write unit SA0-SA3 writes data into a memory cell corresponding thereto in accordance with data applied thereto.

Also, switch unit 400 outputs DataB0 received at terminal DQ0 to each of write units SA0-SA3 in the test mode. Each write unit SA0-SA3 writes data into a memory cell corresponding thereto in accordance with DataB0 applied thereto.

In semiconductor device 100, parallel data is received at a plurality of terminals in the normal operation mode, so that semiconductor device 100 is free from the problem which is experienced by the semiconductor integrated circuit described in JP2001-6396.

Also, semiconductor device 100 reduces terminals DQ0-DQ3 into terminal DQ0 in the test mode.

Accordingly, when semiconductor device 100 is tested using a probe card in the test mode, the test can be conducted for terminals DQ0-DQ3 by connecting a probe arranged on the probe card to terminal DQ0 on semiconductor device 100. As such, movement of the probe card for changing the connection of the probe with terminal DQ can be reduced.

Reduced movements of the probe card provide the following advantages.

When the probe card is moved, friction occurs, as a matter of course, and fragments caused by the friction adversely affects a semiconductor device. When movement of the probe card is reduced, the adverse affection is reduced.

Also, when the probe card is moved, a positional relationship between the probe and the terminal can shift from a positional relationship between the probe and the terminal in design due to errors in mechanical positions. This can cause an increase in potential damages to the semiconductor device. When movement of the probe card is reduced, smaller damage to the semiconductor device will occur.

Further, in some tests, the proportion of the time period, in which the probe card is moved, to the time period, in which a semiconductor device is tested, may increase. With a reduction in movement of the probe card, less time is needed to move the probe card.

However, the inventor of the present application has recognized that semiconductor device 100 has a problem in that write units SA0-SA3, more specifically, a plurality of driving units corresponding to a plurality of terminals cannot be provided with a data pattern different from arbitrary parallel data (hereinafter also called the "data pattern"), for example, parallel data comprised of a plurality of data indicative of the same contents.

Specifically, as shown in FIG. 2, in semiconductor device 100, DataB0 applied to terminal DQ0 is output to each write unit SA0-SA3 in the test mode. Therefore, each write unit SA0-SA3 is provided only with parallel data comprised of a plurality of data indicative of the same contents. For this reason, in semiconductor device 100, an arbitrary data pattern cannot be provided to a plurality of write units SA0-SA3 in the test mode.

Consequently, a test is highly unlikely to be conducted in semiconductor device 100 in the test mode using, for example, a data pattern which can cause interference between write units, and the like.

SUMMARY

The present invention seeks to solve one or more of the above problems, or to improve upon those problems at least in part.

In one embodiment, there is provided a semiconductor device which includes a plurality of terminals, a plurality of driving units corresponding to the plurality of terminals, and a data control unit. The data control unit outputs parallel data applied to the plurality of terminals to the plurality of drive units in a normal operation mode, and converts serial data applied to a particular terminal, which is one of the plurality of terminals, to parallel data to output the parallel data, to which the serial data applied to the particular terminal is converted, to the plurality of drive units in a test mode.

In another embodiment, there is provided a data control method in a semiconductor device that includes a plurality of terminals and a plurality of driving units corresponding to the plurality of terminals. The method includes outputting parallel data applied to the plurality of terminals to the plurality of drive units in a normal operation mode; and converting serial data applied to a particular terminal, which is one of the plurality of terminals, to parallel data to output the parallel data, to which the serial data applied to the particular terminal is converted, to the plurality of drive units in a test mode.

The above and other objects, features, and advantages of the present invention will become apparent from the following description with reference to the accompanying drawings which illustrate an example of the present invention.

BRIEF DESCRIPTION OF THE DRAWINGS

The above feature and advantages of the present invention will be more apparent from the following description of certain preferred embodiments taken in conjunction with the accompanying drawings, in which:

FIG. 7 is a circuit diagram showing an example of JK-FF 210;

FIG. 8 is an explanatory diagram showing logical values of each signal of JK-FF 210;

FIG. 11 is a timing chart showing changes of logical values at each terminal of quinary counter 21; and FIG. 12 is a timing chart for describing the operation of serial/parallel data converter circuit 22.

DETAILED DESCRIPTION OF PREFERRED EMBODIMENTS

First Embodiment

Figure 1:
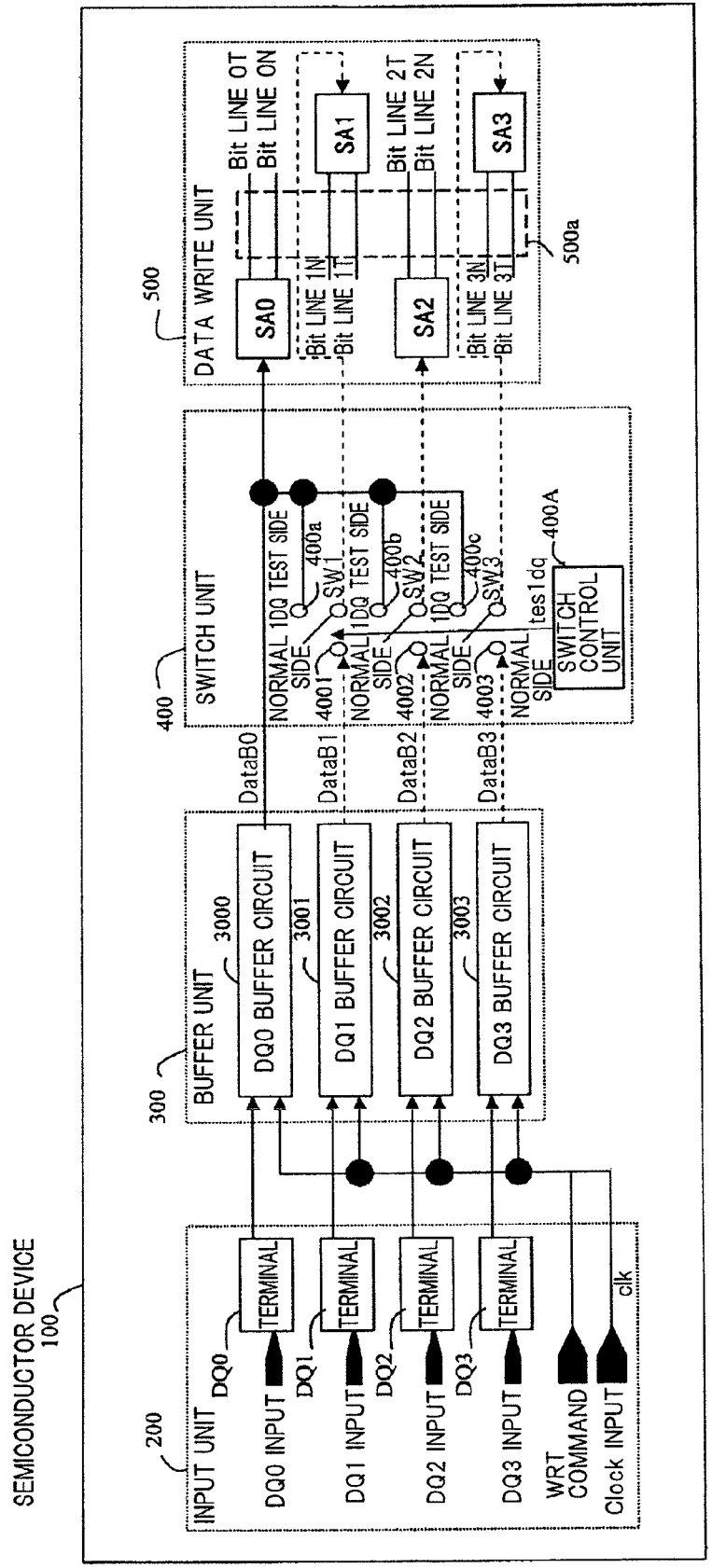
FIG. 1 is a diagram showing a semiconductor device.
Figure 2:
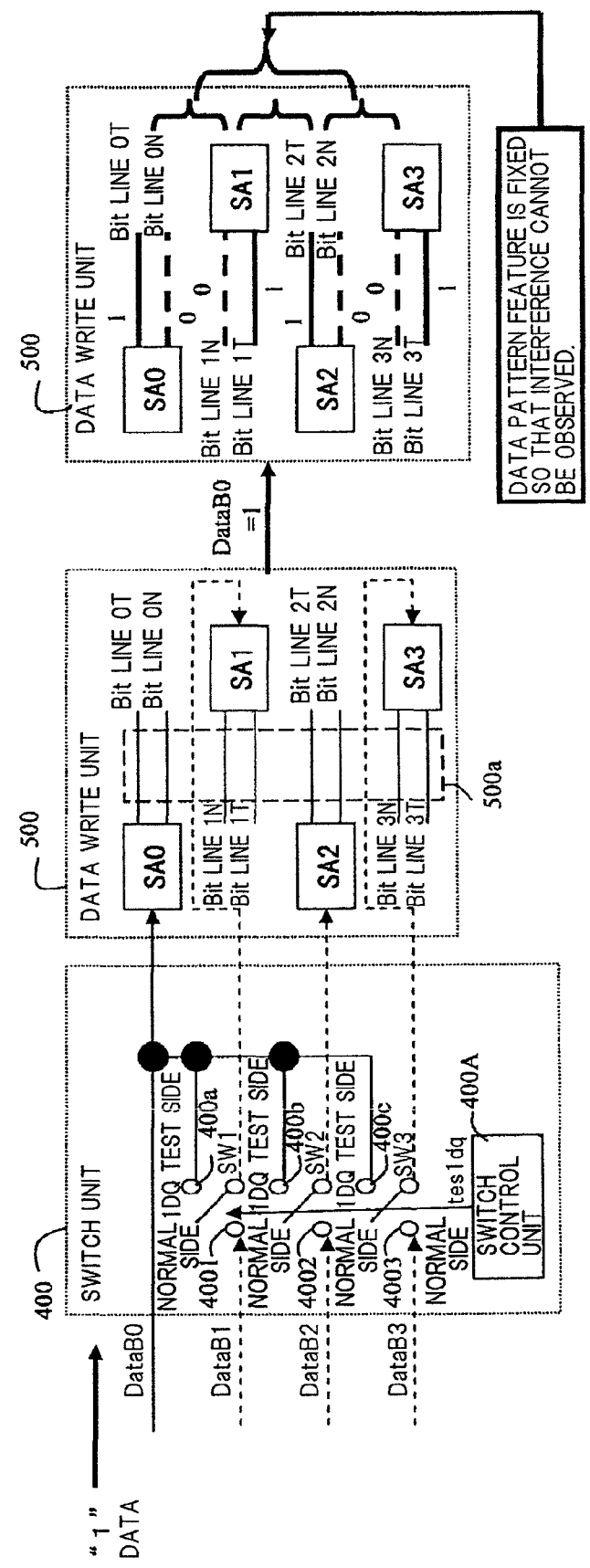
FIG. 2 is an explanatory diagram for describing an exemplary operation of the semiconductor device.
Figure 3:
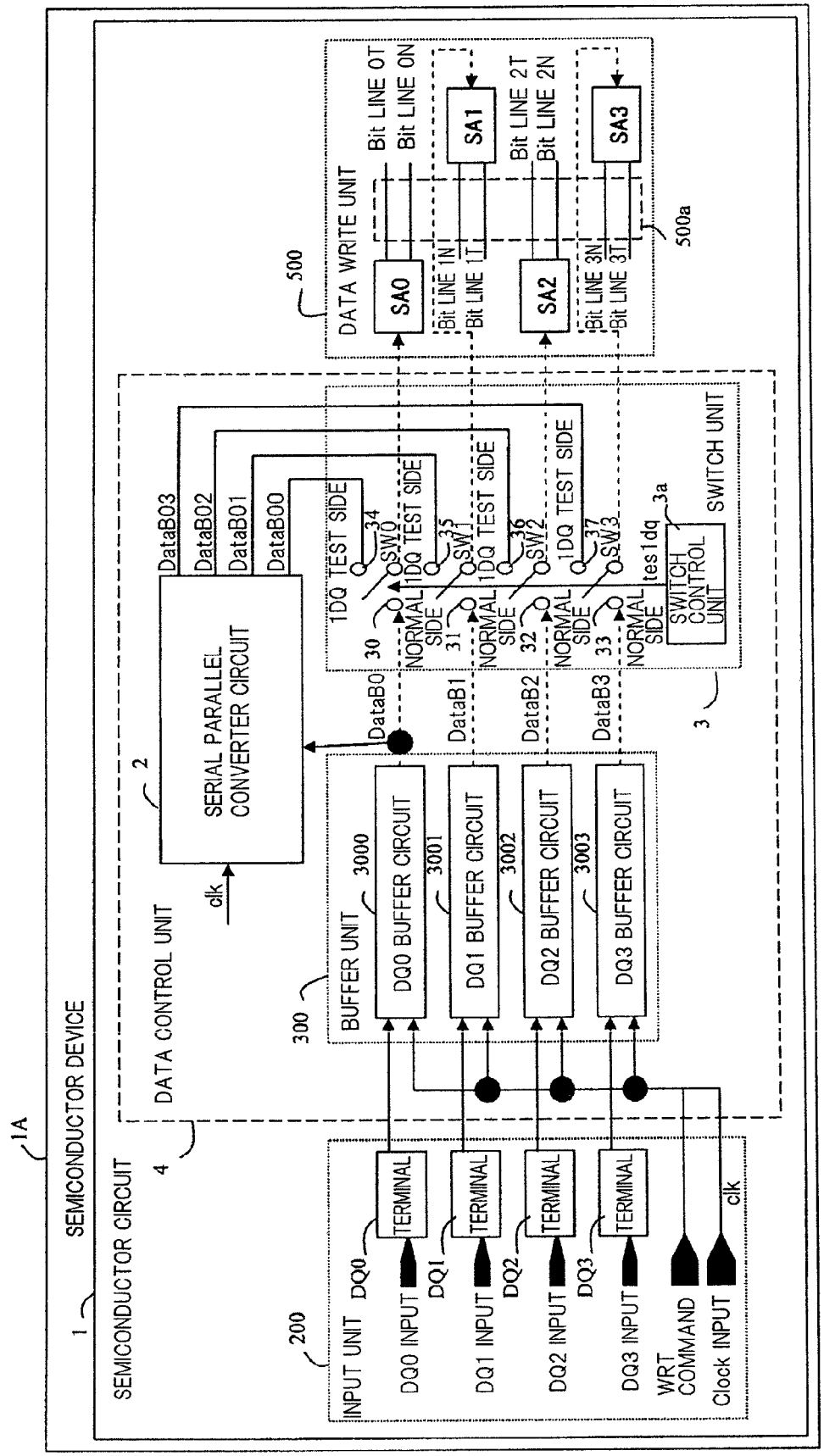
FIG. 3 is a block diagram showing semiconductor device 1A according to one embodiment of the present invention.

In FIG. 3, the same components as those shown in FIG. 1 are designated the same reference numerals.

Semiconductor device 1A shown in FIG. 3 differs from semiconductor device 100 shown in FIG. 1 in that semiconductor device 1A does not comprise switch unit 400, but includes serial/parallel converter circuit 2 and switch unit 3.

In the following, semiconductor device 1A shown in FIG. 3 will be described with focus placed on differences from semiconductor device 100 shown in FIG. 1.

In FIG. 3, semiconductor circuit 1 within semiconductor device 1A comprises serial/parallel converter circuit 2, switch unit 3, input unit 200, buffer unit 300, and data write unit 500. Serial/parallel converter circuit 2, switch unit 3, and buffer unit 300 are included in data control unit 4. Semiconductor circuit 1 also comprises a normal operation mode and a test mode.

Terminals DQ0-DQ3 within input unit 200 are illustrative of a plurality of terminals. Terminal DQ0 is an example of a particular terminal. In this embodiment, the number of terminals DQ is chosen to be four, but the number of terminals DQ is not limited to four but may be changed as required.

Write units SA0-SA3 within data write unit 500 are illustrative of a plurality of driving units. In this embodiment, the number of write units SA is chosen to be four, but the number of write units SA can be changed as required in accordance with the number of terminals DQ.

Each write unit SA0-SA3 writes information into memory cell area 500a based on data provided from data control unit 4.

Data control unit 4 outputs parallel data applied to terminal DQ0-DQ3 to write units SA0-SA3 in the normal operation mode.

In this embodiment, data control unit 4 provides data received at terminal DQ0 to write unit SA0, provides data received at terminal DQ1 to write unit SA1, provides data received at terminal DQ2 to write unit SA2, and provides data received at terminal DQ3 to write unit SA3 in the normal operation mode.

In the test mode, on the other hand, data control unit 4 converts serial data applied to terminal DQ0 to parallel data, and outputs the parallel data after the conversion to write units SA0-SA3.

In this embodiment, terminal DQ0 is applied with serial data comprised of four data DataB00-DataB03 which correspond to write units SA0-SA3, respectively, in the test mode.

Data control unit 4 converts the serial data to parallel data for simultaneously transmitting respective DataB00-DataB03 at least in the test mode.

Data control unit 4 provides the parallel data after conversion to write units SA0-SA3, such that DataB00 within the parallel data is provided to write unit SA0, DataB01 is provided to write unit SA1, DataB02 is provided to write unit SA2, and DataB03 is provided to write unit SA3.

Serial/parallel converter circuit 2 converts, for example, serial data applied to terminal DQ0 in the test mode to parallel data, and outputs the parallel data.

Upon receipt of serial data (DataB0) comprised of DataB00-DataB03 from terminal DQ0, serial/parallel converter circuit 2 converts the serial data to parallel data for simultaneously transmitting respective DataB00-DataB03 and outputs the parallel data.

The test mode is set up when switch unit 3 is receiving control signal tes1dq, while the normal operation mode is set up when switch unit 3 is not receiving control signal tes1dq.

Switch unit 3 outputs parallel data applied to terminals DQ0-DQ3 to write units SA0-SA3 in the normal operation mode, and outputs parallel data delivered from serial/parallel converter unit 2 to write units SA0-SA3 in the test mode.

Switch unit 3 includes a plurality of switches SW0-SW3, and switch control unit 3a.

Switch control unit 3a connects switches SW0-SW3 to normal side terminals 30-33, respectively, when switch control unit 3a is not receiving control signal tes1dq, i.e., in the normal operation mode. On the other hand, switch control unit 3a connects switches SW0-SW3 to 1DQ test side terminals 34-37, respectively, when switch control unit 3a is receiving control signal tes1dq, i.e., in the test mode.

Specifically, normal side terminal 30 is provided with DataB0, normal side terminal 31 is provided with DataB1, normal side terminal 32 is provided with DataB2, and normal side terminal 33 is provided with DataB3.

In the test mode, on the other hand, 1DQ test side terminal 34 is provided with DataB00 from serial/parallel converter circuit 2, 1DQ test side terminal 35 is provided with DataB01 from serial/parallel converter circuit 2, 1DQ test side terminal 36 is provided with DataB02 from serial/parallel converter circuit 2, and IDQ test side terminal 37 is provided with DataB03 from serial/parallel converter circuit 2.

Figure 4:
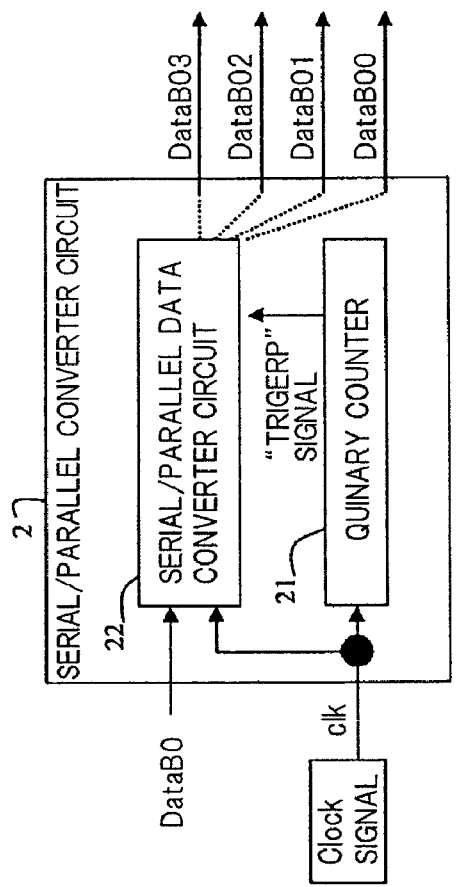
FIG. 4 is a block diagram showing an example of serial/parallel conversion unit 2.

FIG. 4 is a block diagram showing an example of serial/parallel conversion unit 2. Serial/parallel conversion unit 2 is not limited to that shown in FIG. 4, but can be modified as required.

In FIG. 4, serial/parallel conversion unit 2 includes quinary counter 21, and serial/parallel data converter circuit 22.

Quinary counter 21 outputs a TRIGERP signal to serial/parallel data converter circuit 22 when quinary counter 21 counts five clk signals.

Serial/parallel data converter circuit 22 receives DataB00-DataB03, which comprise serial data DataB0, one by one in synchronization with the clk signal, to convert serial data DataB0 to parallel data comprised of DataB00-DataB03.

Serial/parallel data converter 22 also provides switch unit 3 with the parallel data comprised of DataB00-DataB03 in accordance with the TRIGERP signal and clk signal.

Figure 5:
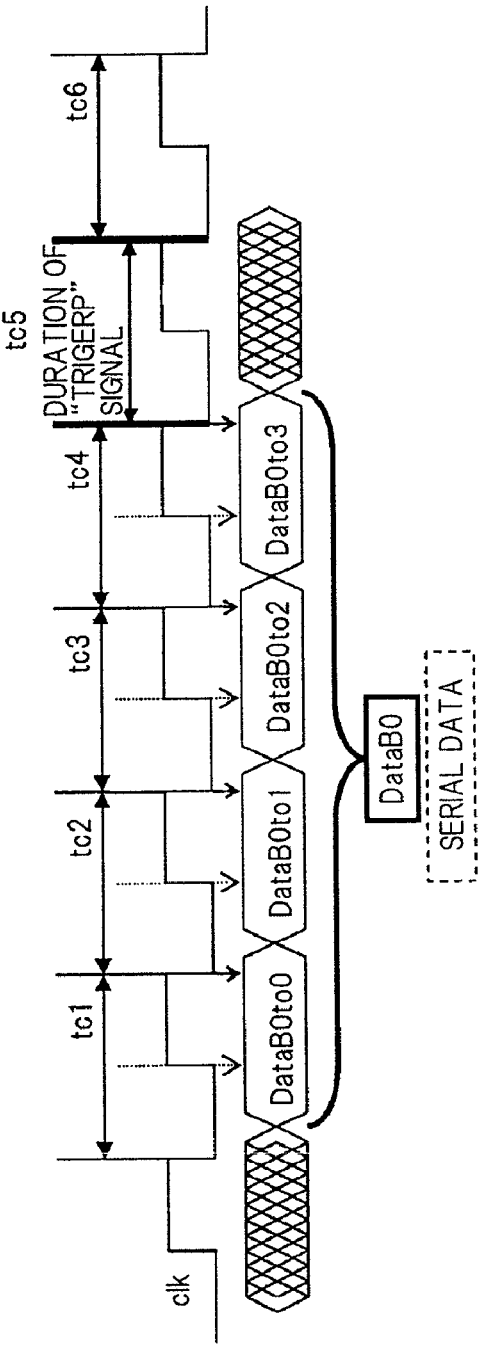
FIG. 5 is a timing chart for describing the operation of serial/parallel converter circuit 2.

FIG. 5 is a timing chart for describing the operation of serial/parallel converter circuit 2.

As shown in FIG. 5, serial/parallel converter circuit 2 receives DataB00 in interval tc1; DataB01 in interval tc2; DataB02 in interval tc3; and DataB03 in interval tc4.

In this embodiment, serial/parallel converter circuit 2 holds each data item (DataB00-DataB03) using a rising edge of the clk signal, a High state of the clk signal, and a falling edge of the clk signal in each of intervals tc1-tc4.

Figure 6:
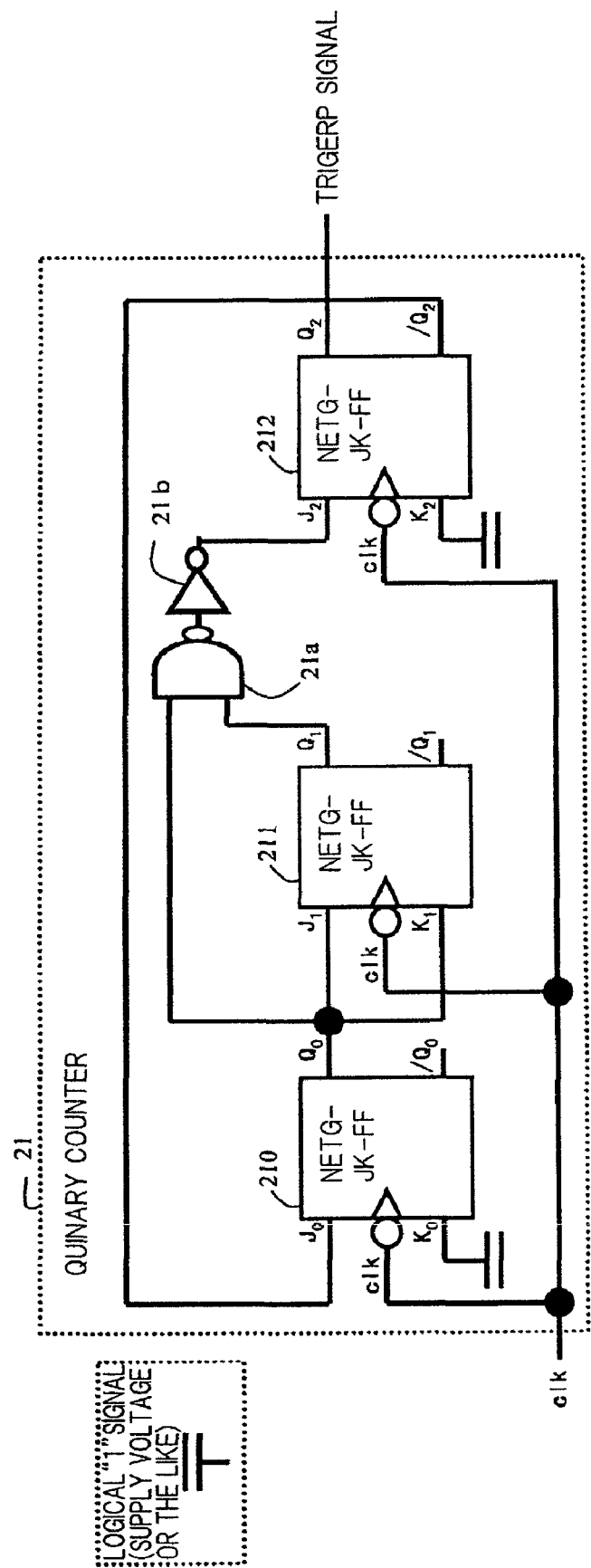
FIG. 6 is a circuit diagram showing an example of quinary counter 21.

FIG. 6 is a circuit diagram showing an example of quinary counter 21. Quinary counter 21 is not limited to that shown in FIG. 6, but can be modified as required.

In FIG. 6, quinary counter 21 includes negative edge trigger JK flip-flops (NETG-JK-FF, hereinafter simply called "JK-FF") 210-212, NAND gate 21a, and inverter 21b.

Each JK-FF 210-212 receives inverted clk signal at a clock terminal. A High-level (logical "1") signal (supply voltage or the like) is applied to terminal $K_0$ of JK-FF 210 and to terminal $K_2$ of JK-FF 212. Terminal $J_0$ of JK-FF 210 is connected to terminal/$Q_2$ (inverting output terminal) of JK-FF 212. Terminal $Q_0$ of JK-FF 210 is connected to terminal $J_1$ and Terminal K1 of JK-FF 211 and to one input terminal of NAND gate 21a. The other input terminal of NAND gate 21a is connected to terminal $Q_1$ of JK-FF 211. The output of NAND gate 21a is inverted by inverter 21b, and then applied to terminal $J_2$ of JK-FF 212. The TRIGERP signal is output from $Q_2$ terminal of JK-FF 212.

FIG. 7 is a circuit diagram showing an example of JK-FF 210. JK-FF 210 is not limited to that shown in FIG. 7, but can be modified as required. Also, in this embodiment, JK-FF 211-FF212 are also identical in configuration to JK-FF 210 shown in FIG. 7.

In FIG. 7, JK-FF 210 comprises NAND gates 51-58. JK-FF 210 is provided with reset nodes 5a, 5b for receiving an INIT signal in order to establish an initial state.

FIG. 8 is an explanatory diagram showing logical values of each signal of JK-FF 210 which is placed into a reset state immediately after the INIT signal goes ON.

Figure 9:
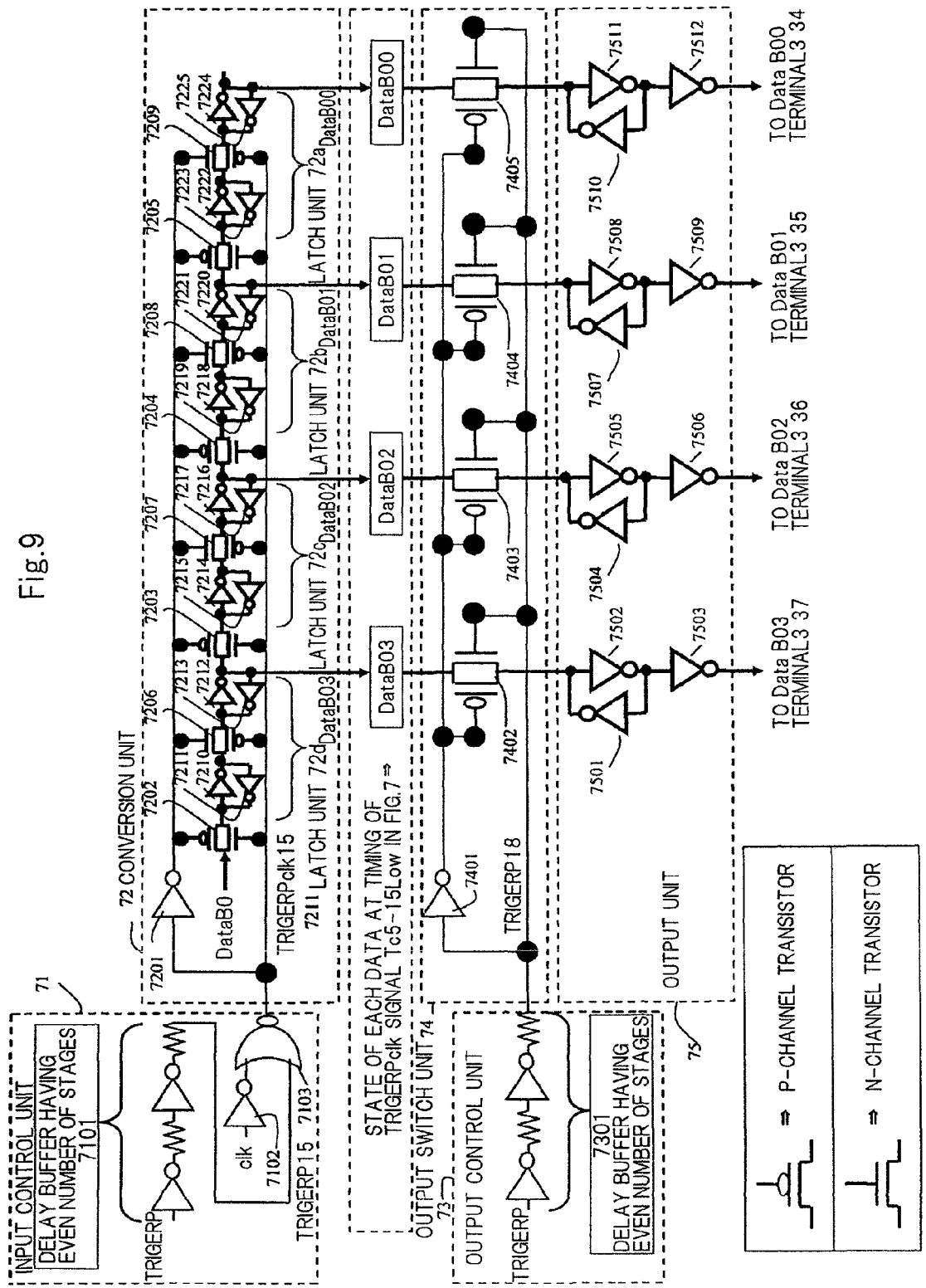
FIG. 9 is a circuit diagram showing an example of serial/parallel data converter circuit 22.

FIG. 9 is a circuit diagram showing an example of serial/parallel data converter circuit 22. Serial/parallel data converter circuit 22 is not limited to that shown in FIG. 9, but can be modified as required.

In FIG. 9, serial/parallel data converter circuit 22 comprises input control unit 71, conversion unit 72, output control unit 73, output switch unit 74, and output unit 75.

Input control unit 71 includes Delay Buffer (hereinafter called the "delay unit") 7101 having a plurality of stages, each made up of an inverter and a resistor, inverter 7102, and NOR gate 7103. NOR gate 7103 receives a clk signal inverted by inverter 7102, and a TRIGERP signal delayed by delay unit 7101 (hereinafter called the "TRIGERP15 signal").

Accordingly, input control unit 71 outputs the clk signal as a TRIGERPclk15 signal when it is not provided with the TRIGERP15 signal (when the TRIGERP15 signal is at Low level). On the other hand, input control unit 71 outputs a signal at Low level as the TRIGERPclk15 signal when it is provided with TRIGERP15 signal (when the TRIGERP15 signal is at H level).

In this regard, the delay amount of delay unit 7101 will be described later.

Conversion unit 72 includes inverter 7201, transfer gates 7202-7209, and inverters 7210-7225.

Inverter 7201 inverts the output of input control unit 71 (TRIGERPclk15 signal), and outputs the inverted TRIGERPclk15 signal.

Transfer gate 7202 receives serial data DataB0 from terminal DQ0.

Transfer gates 7202-7205 turn on when the output of input control unit 71 (TRIGERPclk15 signal) is at High level, and turn off when the output of input control unit 71 (TRIGERPclk15 signal) is at Low level.

Transfer gates 7206-7209 turn off when the output of input control unit 71 (TRIGERPclk15 signal) is at High level, and turn on when the output of input control unit 71 (TRIGERPclk15 signal) is at Low level.

Inverters 7210-7213 and Transfer gate 7206 are included in latch unit 72d. Inverters 7214-7217 and transfer gate 7207 are included in latch unit 72c. Inverters 7218-7221 and transfer gate 7208 are included in latch unit 72b. Inverters 7222-7225 and transfer gate 7209 are included in latch unit 72a.

Output control unit 73 includes Delay Buffer (hereinafter called the "delay unit") 7301 having a plurality of stages, each made up of an inverter and a resistor. Delay unit 7301, i.e., output control unit 73 delays the TRIGERP signal.

In this regard, the delay amount of delay unit 7301 will be described later.

Output switch unit 74 includes inverter 7401, and transfer gates 7402-7405.

Transfer gates 7402-7405 turn on when the output of output control unit 73 (TRIGERP18 signal) is at High level, and turn off when the output of output control unit 73 (TRIGERP18 signal) is at Low level.

Transfer gate 7402 receives the output of latch unit 72d. Transfer gate 7403 receives the output of latch unit 72c. Transfer gate 7404 receives the output of latch unit 72b. Transfer gate 7405 receives the output of latch unit 72a.

Output unit 75 includes inverters 7501-7512.

Next, the operation will be described.

First, the operation in the normal operation mode will be described with reference to FIG. 3.

In the normal operation mode, terminals DQ0-DQ3 are applied with parallel data, but switch control unit 3a is not applied with control signal tes1*dq*.

Since switch control unit 3a is not receiving control signal tes1*dq*, switches SW0-SW3 are connected to normal side terminals 30-33, respectively.

Accordingly, in the normal operation mode, data control unit 4 outputs the parallel data applied to terminals DQ0-DQ3 to write units SA0-SA3.

Next, operation in the test mode will be described with reference to FIG. 3.

In the test mode, serial data for testing is applied to terminal DQ0 among terminals DQ0-DQ3, and control signal tes1*dq* is applied to switch control unit 3a.

Serial/parallel converter circuit 2 receives serial data comprised of DataB00-DataB03 from terminal DQ0, and converts this serial data to parallel data for simultaneously transmitting respective DataB00-DataB03. Serial/parallel converter circuit 2 outputs the parallel data to 1DQ test side terminals 34-37.

Since switch control unit 3a is receiving control signal tes1*dq*, switches SW0-SW3 are connected to 1DQ test side terminals 34-37, respectively.

Accordingly, in the test mode, data control unit 4 converts the serial data received by terminal DQ0 to parallel data, and provides the parallel data after the conversion to write units SA0-SA3.

Figure 10:
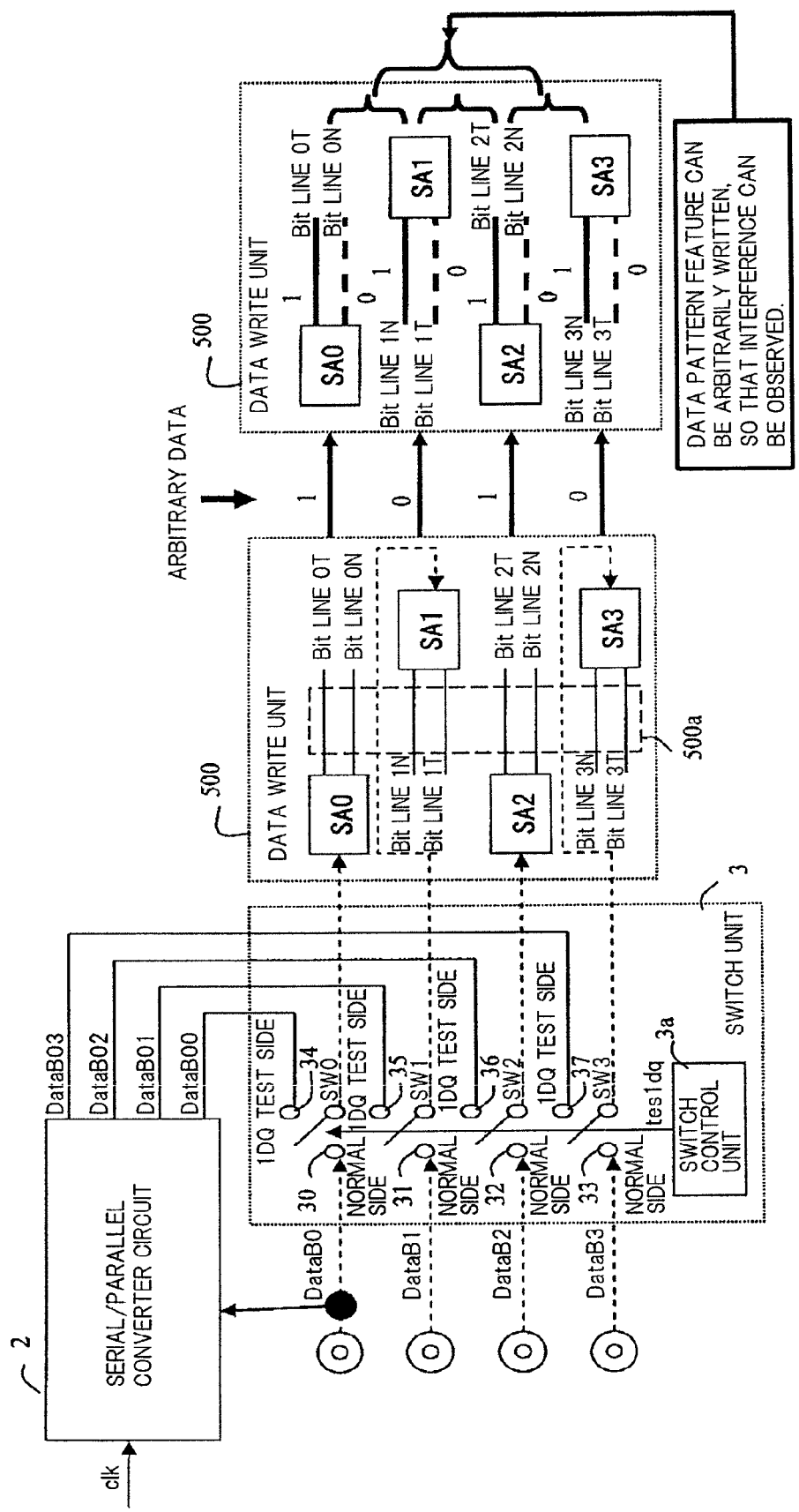
FIG. 10 is an explanatory diagram for describing exemplary operations of semiconductor device 1A.

Thus, during the test mode, since the contents of the serial data (DataB00-DataB03) received by terminal DQ0 is set in an arbitrary manner, write units SA0-SA3 can be provided with parallel data comprised of arbitrary data (see FIG. 10).

Now, referring to FIGS. 6, 9, 11, and 12, a description will be given of the operation of serial/parallel converter circuit 2 in the test mode, specifically, the operation of serial/parallel converter circuit 2 which includes quinary counter 21 shown in FIG. 6 and serial/parallel data converter circuit 22 shown in FIG. 9.

Specifically, FIG. 11 is a timing chart showing changes of logical values at each terminal of quinary counter 21 shown in FIG. 6. FIG. 12 in turn is a timing chart for describing the operation of serial/parallel data converter circuit 22 shown in FIG. 9.

In FIG. 11, the clk signal is started from Low level, and tc1 denotes an interval from the start to the end of the first High state, and tc2, tc3, tc4, tc5, tc6, tc7 denote intervals up to the end of the second and subsequent High level states, as shown in FIG. 5.

In this event, at a timing of a falling edge of the clk signal at which interval tc4 finishes, a pulse at High level is generated at terminal $Q_2$, as shown in FIG. 11. This High-level pulse is used as the aforementioned TRIGERP signal. The TRIGERP signal finishes at a timing of a falling edge of the clk signal at which interval tc5 terminates, and subsequently, terminal $Q_2$ returns to Low level.

Notably, the timing of each clk signal and notations tcy (y=1-7) for the respective intervals, shown in FIGS. 11 and 5, have the same meaning.

Input control unit 71 shown in FIG. 9 is applied with the TRIGERP signal and clk signal, while output control signal 73 is applied with the TRIGERP signal.

As shown in FIG. 12, the delay amount of delay unit 7101 within input control unit 71 is set such that the TRIGERP15 signal rises to High level in a time period from the timing of a falling edge of the clk signal at which interval tc4 terminates to the timing of a rising edge of the clk signal within interval tc5, and such that the TRIGERP15 signal falls to Low level in a time period from the timing of the falling edge of the clk signal at which interval tc5 terminates to a timing of a rising edge of the clk signal within interval tc6. Thus, input control unit 71 outputs the TRIGERPclk15 signal as shown in FIG. 12.

As shown in FIG. 12, the TRIGERPclk15 signal masks High level of the clk signal within interval tc5 against each transfer gate 7202-7209 of conversion unit 72.

As such, the TRIGERPclk15 signal can fix the state of transfer gates 7202-7209 until just before the timing of the rising edge of the clk signal within next interval tc6.

In FIG. 12, a Low-level period of this TRIGERPclk15 signal is described by "Tc5-15 Low," which period serves to hold the data states of output switch unit 74 and output unit 75, later described.

Also, the delay amount of delay unit 7301 within output control unit 73 is set, in the same concept as the generation of the TRIGERPclk15 signal, such that the output at High level from output control unit 73 (hereinafter "TRIGERP18 signal") is sent to each transfer gate 7402-7405 within output switch unit 74 within interval Tc5-15 Low, as shown in FIG. 12.

A High-level period of the TRIGERP18 signal is designated by "TR18High."

Within conversion unit 72, transfer gates 7202-7205 turn on when the output of input control unit 71 is High level, and turn off when the output of input control unit 71 is at Low level, and transfer gates 7206-7209 turn off when the output of input control unit 71 is at High level, and turn on when the output of input control unit 71 is at Low level.

Accordingly, conversion unit 72 captures DataB00-DataB30 one by one in synchronization with the clk signal under a situation where it is not provided with the TRIGERP15 signal (where the TRIGERP15 signal is at Low level).

Notably, FIG. 9 shows a state immediately after the falling edge of the clk signal at which interval tc4 terminates. At this time, DataB00, DataB01, DataB02, and DataB03 are set into latch unit 72a, latch unit 72b, latch unit 72c, and latch unit 72d, respectively.

At the timing of the rising edge of the clk signal within subsequent interval tc5, the TRIGERPclk15 signal is at Low level, so that conversion unit 72 does not perform any new operation, and the data (DataB00, DataB01, DataB02, DataB03) are held in respective latch sections 72a-72d, respectively.

In this state, at High level of the TRIGERP18 signal from output control unit 73, respective transfer gates 7402-7405 within output switch unit 74 simultaneously turn on, causing DataB00, DataB01, DataB02, and DataB03 to be simultaneously output to switch unit 3 through output switch unit 74 and output unit 75, and subsequently to be simultaneously output to write units SA0-SA3.

Specifically, DataB00 so far held in latch unit 72a is output to 1DQ test side terminal 34 (see FIG. 3) through transfer gate 7405, and inverters 7510-7512 within output unit 75.

DataB01 so far held in latch unit 72b, in turn, is output to 1DQ test side terminal 35 (see FIG. 3) through transfer gate 7404, and inverters 7507-7509 within output unit 75.

DataB02 so far held in latch unit 72c, in turn, is output to 1DQ test side terminal 36 (see FIG. 3) through transfer gate 7403, and inverters 7504-7506 within output unit 75.

DataB03 so far held in latch unit 72d, in turn, is output to 1DQ test side terminal 37 (see FIG. 3) through transfer gate 7402, and inverters 7501-7503 within output unit 75.

According to this embodiment, data control unit 4 outputs parallel data applied to terminals DQ0-DQ3 to write units SA0-SA3 in the normal operation mode, and converts serial data applied to terminal DQ0 to parallel data and outputs the parallel data, to which the serial data applied to the particular terminal is converted, to write units SA0-SA3 in the test mode.

Accordingly, no processing is required to convert serial data to parallel data in the normal operation mode, thus making it possible to prevent a delay in the normal operation associated with this processing. In the test mode, on the other hand, write units SA0-SA3 can be provided with parallel data comprised of arbitrary data by arbitrarily setting the contents of serial data applied to terminal DQ0.

Thus, in a semiconductor device which is applied with parallel data at a plurality of terminals in the normal operation mode and which is applied with serial data at a particular terminal among the plurality of terminals in the test mode, an arbitrary data pattern can be provided to a plurality of driving units in the test mode.

It is therefore possible to test, for example, a data pattern which can cause a plurality of driving units to interfere with one another, under the test mode.

In this embodiment, data control unit 4 includes serial/parallel conversion unit 2, and switch unit 3.

Serial/parallel converter circuit 2 converts, for example, serial data applied to terminal DQ0 to parallel data and outputs the parallel data in the test mode. Switch unit 3 outputs the parallel data applied to terminals DQ0-DQ3 to write units SA0-SA3 in the normal operation mode, and outputs the parallel data output from serial/parallel conversion unit 4b to write unit SA0-SA3 in the test mode.

In this event, data provided to write units SA0-SA3 can be switched under the control of switch unit 3.

In this embodiment, the write units for writing information into memory cell area 500a are used as the driving units.

In this event, a plurality of write units can be provided with a variety of test data corresponding to a variety of operating situations of the plurality of write units.

It is therefore possible to test a semiconductor device, for example, with a data pattern which can cause a plurality of write units to interfere with one another, under the test mode.

Alternatively, only one semiconductor circuit 1 shown in FIG. 3 may be mounted on one semiconductor device, or a plurality of semiconductor circuits 1 may be mounted on one semiconductor device.

For example, when 16 semiconductor circuits 1 are mounted on one semiconductor device, 64 terminals DQ are reduced into 16 terminals DQ in the test mode.

In the foregoing embodiment, since the number of the plurality of terminals is chosen to be "4," a quinary counter is provided in serial/parallel converter circuit 4b, and the number of latch units included in the serial/parallel data converter circuit is chosen to be "4" in serial/parallel converter circuit 4b.

However, a countable number of the counter within serial/parallel converter circuit 4b, and the number of latch units included in the serial/parallel data converter circuit within serial/parallel converter circuit 4b can be changed in accordance with the number of the plurality of terminals.

It is apparent that the present invention is not limited to the above embodiments, but may be modified and changed without departing from the scope and spirit of the invention.

What is claimed is:

1. A semiconductor device comprising: a plurality of terminals; a plurality of drive units corresponding to said plurality of terminals; and a data control unit which outputs parallel data applied to said plurality of terminals to said plurality of drive units in a normal operation mode, and which converts serial data applied to a particular terminal, which is one of said plurality of terminals, to parallel data, to output the parallel data to which the serial data applied to the particular terminal is converted to said plurality of drive units in a test mode, wherein said data control unit includes:
   a serial/parallel conversion unit which converts the serial data applied to said particular terminal to parallel data and outputs the parallel data; and
   a switch unit which outputs the parallel data applied to said plurality of terminals to said plurality of drive units in the normal operation mode, and outputs the parallel data output from said serial/parallel conversion unit to said plurality of drive units in the test mode.

2. A semiconductor device comprising: a plurality of terminals; a plurality of drive units corresponding to said plurality of terminals; and a data control unit which outputs parallel data applied to said plurality of terminals to said plurality of drive units in a normal operation mode, and which converts serial data applied to a particular terminal, which is one of said plurality of terminals, to parallel data, to output the parallel data to which the serial data applied to the particular terminal is converted to said plurality of drive units in a test mode, wherein each of said drive units comprises a write unit which writes information into a memory cell area based on data applied from said data control unit.

3. The semiconductor device according to claim 1, wherein each of said drive units comprises a write unit which writes information into a memory cell area based on data applied from said data control unit.

4. A device comprising:
   a plurality of terminals;
   a plurality of drive units provided correspondingly to the terminals;
   a data control circuit including a first input node coupled to one of the terminals and a plurality of first output nodes, the data control circuit being configured to respond to data supplied to the first input node from the one of the terminals and produce data at first output nodes, respectively; and a switch circuit including a plurality of second input nodes each coupled to an associated one of the terminals, a plurality of third input nodes each coupled to an associated one of the first output nodes of the data control circuit and a plurality of second output nodes each coupled to an associated one of the drive units, the switch circuit being configured to electrically connect each of the second output nodes to an associated one of the second input nodes in a normal operation mode and to an associated one of the third input nodes in a test mode.

5. The device as claimed in claim 4, wherein each of the drive units comprises a write unit that writes information into a memory cell area in response to a signal from an associated one of the terminals in the normal operation mode and from an associated one of the second output nodes of the data control circuit in the test mode.

6. The device as claimed in claim 4, wherein the data control circuit comprises a serial/parallel conversion unit to convert the serial data from the one of the terminals to the parallel data.

7. The device as claimed in claim 6, wherein the data control circuit further comprises a counter controlling the serial/parallel conversion unit.

8. The device as claimed in claim 4, further comprising a memory cell area that comprises a plurality of sense amplifiers each operatively coupled to an associated one of the drive units and a plurality of memory cells each operatively coupled to an associated one of the sense amplifiers.

9. The device as claimed in claim 4, further comprising a plurality of buffer circuits each inserted between an associated one of the terminals and an associate one of the second input nodes of the switch circuit.

* * * * *